United States Patent [19]

Rokos

[11] 4,074,143
[45] Feb. 14, 1978

[54] OPTOELECTRONIC DEVICE WITH OPTICAL FEEDBACK

[75] Inventor: George Hedley Storm Rokos, Hitchen, England

[73] Assignee: Xerox Corporation, Stamford, Conn.

[21] Appl. No.: 666,981

[22] Filed: Mar. 15, 1976

[30] Foreign Application Priority Data

Oct. 24, 1975 United Kingdom ............... 43925/75

[51] Int. Cl.² ............................. G01J 1/32; H01L 9/00
[52] U.S. Cl. ............................... 250/552; 331/94.5 S;
357/19; 315/134; 250/205
[58] Field of Search ....................... 250/205, 551, 552;
331/94.5 S; 357/19; 315/134, 151; 354/53

[56] References Cited

U.S. PATENT DOCUMENTS 3,748,480  7/1973  Coleman ............................. 250/551
3,946,335  3/1976  De Loach, Jr. et al. ....... 331/94.5 S Primary Examiner—Alfred E. Smith
Assistant Examiner—David K. Moore
Attorney, Agent, or Firm—M. J. Colitz, Jr.; T. J. Anderson; I. Keschner

[57] ABSTRACT

An optoelectronic device comprising a light-sensitive device which produces or modifies an electric current in dependence upon the intensity of light incident thereon, and a light-emitting device arranged to emit light in response to said electric current and so disposed that part of said emitted light is incident upon the light-sensitive device to provide positive feedback.

4 Claims, 6 Drawing Figures

OPTOELECTRONIC DEVICE WITH OPTICAL FEEDBACK

BACKGROUND OF THE INVENTION

This invention relates to an optoelectronic device comprising a combination of a light emitter and a light-sensitive device.

In one known combination of a light emitter and a light-sensitive device, an input electrical current causes the light emitter to emit light which is received by the light-sensitive device to produce or modify an output electrical current. Such a combination may be used to provide non-electrical coupling between two electric circuits.

In another known combination of a light emitter and a light-sensitive device, a light input to the light-sensitive device produces or modifies an electric current flowing therefrom to a light emitter, the light emitter producing a light output related to the light input to the combination. Such a combination may be used as a light amplifier or repeater.

OBJECTS OF THE INVENTION

An object of the present invention is to provide an improved optoelectronic device.

A further object of the present invention is to provide an improved optoelectronic device having positive feedback.

SUMMARY OF THE INVENTION

According to the present invention, there is provided an optoelectronic device comprising a light-sensitive device which produces or modifies an electric current in dependence upon the intensity of light incident thereon, and a light-emitting device arranged to emit light in response to said electric current and so disposed that part of said emitted light is incident upon the light-sensitive device to provide positive feedback.

DETAILED DESCRIPTION OF THE INVENTION

Figure 1:
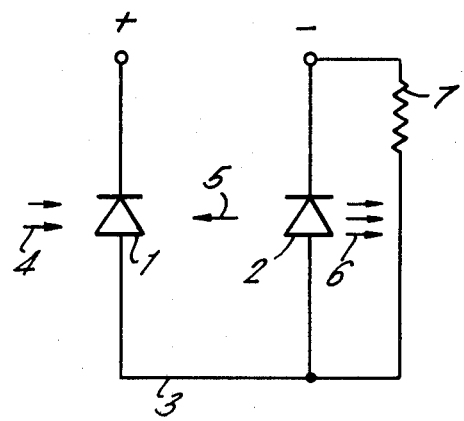
FIG. 1 is a circuit diagram illustrating a basic equivalent circuit of the device of the invention.

Referring now to FIG. 1, a light-sensitive device 1 and a light-emitting device 2 are so disposed and electrically connected that electric currents generated or modified by the light-sensitive device control the emission of light by the light-emitting device. In the equivalent circuit shown, the light-sensitive device 1 is a reverse biased diode, such as an avalanche photodiode, and the light-emitting device 2 is a forward biased light-emitting diode. The use of an avalanche photodiode is one way of providing the electronic gain needed in the circuit for best results. The light-emitting diode may alternatively, or in addition, provide the gain. The two diodes are electrically connected by a conductive line 3, their opposite terminals being connected as shown to the positive and negative terminals of a DC power supply. The light-sensitive device 1 is arranged to receive input external light 4 which produces or modifies the current flowing in line 3 in dependence upon the intensity of the input light 4. The current flowing in line 3 in turn causes or modifies the light emission from the light-emitting device 2. The light-emiting device 2 is so positioned in relation to the light-sensitive device 1 that part of the emitted light, represented in the drawing as feedback light 5, falls on the light-sensitive device 1, thereby establishing a positive feedback loop. The remainder of the emitted light constitutes the output light 6 of the device.

The circuit can be made to exhibit thresholding by providing the light-emitting device 2 with a shunt resistance 7. Limiting can be achieved by a series resistance (not shown) in the power supply, or by the saturation of the output of the light-emitting device 2. Re-timing could be incorporated by alteration of the bias and hence gain of the system.

Although the word "light" is used throughout this specification, it is to be understood that the invention is not limited to devices using only visible electromagnetic radiation. The word "light" in this specification is intended to cover both visible and invisible radiation, including, for example, infra red and ultra violet radiation.

Figure 2:
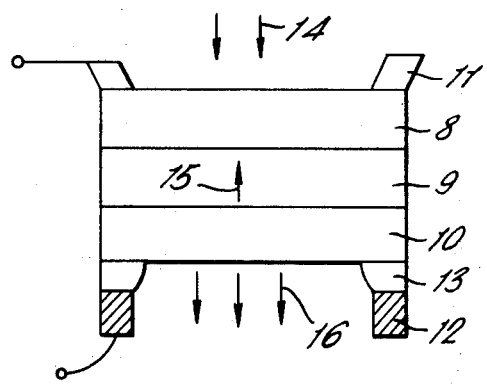
FIG. 2 is a sectional view of a first exemplary embodiment of the device.

Referring now to FIG. 2, there is illustrated one way in which the device of the invention may be constructed in monolithic form from a series of layers of of semiconducting materials. The uppermost layer 8 is of N-type GaAs, and the intermediate layer 9 is of intrinsic GaAlAs, these two forming an avalanche photodiode at their junction. The lowermost layer 10 is of P-type GaAl+As, forming with the intermediate layer 9 a light-emitting diode at their junction. All three layers are translucent, and are effectively electrically connected in accordance with FIG. 1, the uppermost layer 8 having a conductive contact 11, and the lowermost layer 10 being connected to a conductive contact 12 via an intervening member 13 of P-type +GaAs. Contacts 11 and 12 are connected respectively to positive and negative terminals of a power supply (not shown), and the intermediate layer 9 is common to both the photodiode and the light-emitting diode, corresponding with the line 3 of FIG. 1.

Input light 14 is incident on the outer surface of the uppermost layer 8 causing a corresponding current to flow from the photodiode junction between layers 8 and 9 across the light-emitting junction between layers 9 and 10. This current causes light emission from the junction between layers 9 and 10, some of which light, represented in the drawing as feedback light 15, is incident on the photodiode junction between layers 8 and 9. This establishes the positive feedback loop described above with reference to FIG. 1. The remainder of the light emitted by the light-emitting junction is represented as the output light 16 of the device.

Leakage across the light-emitting junction provides thresholding, being equivalent to the shunt resistance 7 of FIG. 1.

Figure 3:
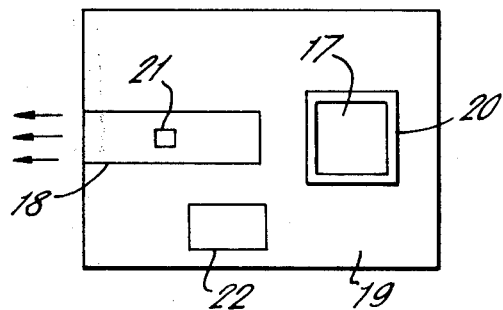
FIG. 3 is a plan view of a second embodiment of the device.

By using the appropriate physical and electrical configuration, the light-emitting junction may be operated as a semiconductor laser. One such possible configuration is shown in FIG. 3. In the arrangement shown, an avalance photodiode 17 and a semiconductor lasing region 18 are formed, side by side, on a common substrate 19. Electrical connections are made, in accordance with one of the circuits shown in FIGS. 4, 5 and 6, by way of a photodiode contact 20, a laser contact 21, and a substrate contact 22. In one suitable arrangement, the devices 17 and 18 are on an isolated region of the substrate which is connected to the remainder of the substrate by resistive means (not shown), so as to constitute a circuit of the kind shown in FIG. 5.

In the case where the light-emitting device is a laser, it may be necessary to provide a bias which is such as to bring the laser near its lasing threshold. In these circumstances, the devices may be incorporated in one of the circuits shown in FIGS. 4, 5 and 6.

Figure 4:
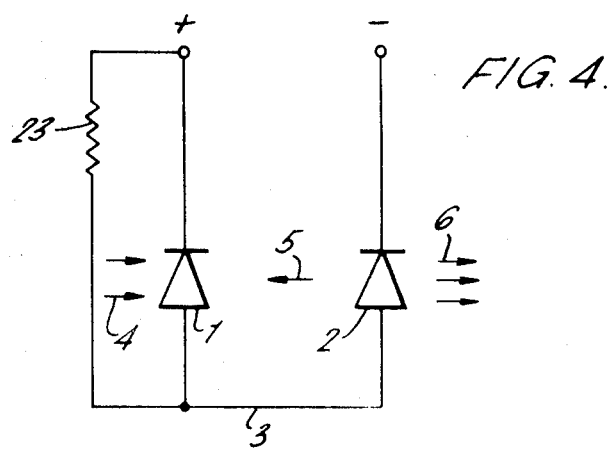
FIGS. 4 to 6 are circuit diagrams showing alternative circuits suitable for use when the light emitting device is a laser.
Figure 5:
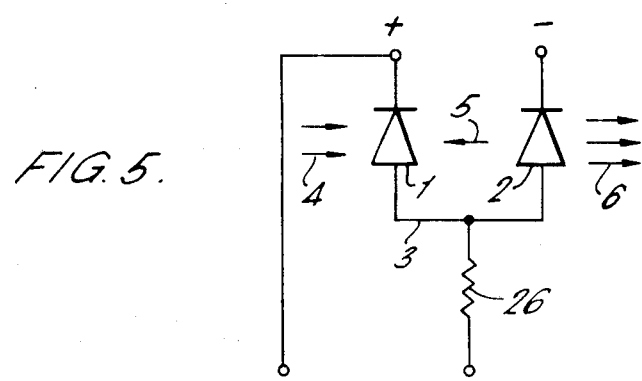
Figure 6:
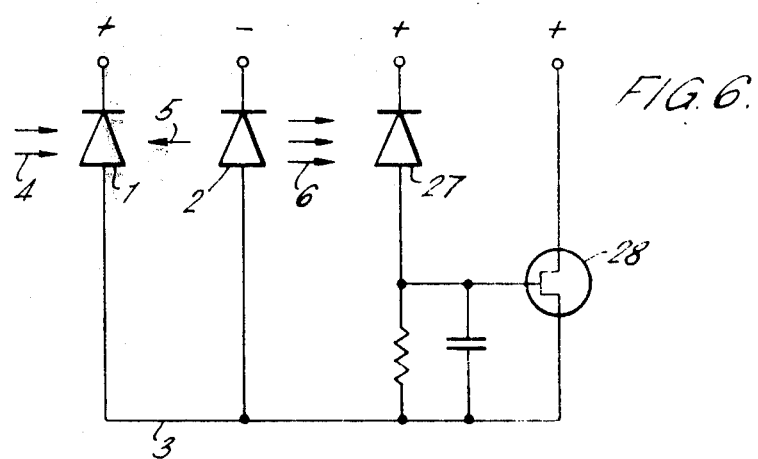

Referring now to FIGS 4, 5 and 6, there are shown three alternative circuits incorporating a laser. In these figures the reference numerals of corresponding parts are consistent with those of FIG. 1. In FIG. 4, the light-emitting device 2, in this case a laser, has an intrinsic threshold. The necessary bias to bring it to this threshold is provided by a resistor 23 in parallel with the photodiode 1. FIG. 5 shows a circuit providing independently controlled thresholds, control being achieved via terminals 24 and 25, terminal 25 being connected to conductor 3 through a resistor 26. FIG. 6 shows a circuit for providing laser threshold control. The bias applied to the conductor 3 is supplied via a diode 27 and an enhancement field effect transistor 28, connected as shown.

The device of the invention finds application as a compact light amplifier or repeater. It could, for example, be used as a repeater and amplifier in the transmission of light along optical fibres. A chain of repeaters, each in accordance with the invention, placed at intervals along an optical fibre cable, provide an efficient long range transmission line. If optical feedback between the output of one repeater and the input of the previous repeater in the chain were to prove troublesome, it would be possible to make each successive light-sensitive device in the chain sensitive to light of a longer wavelength than the one before it. The light-sensitive device of the first repeater in the chain is made sensitive to light of wavelengths up to the wavelength of light emitted by its associated light-emitting device. With an input wavelength less than this, the repeater functions are explained above, emitting light, of wavelength longer than that arriving at its own input, to the light-sensitive device of the next repeater in the chain. This in turn is sensitive to light arriving from the previous repeater, and to longer wavelengths up to the wavelength of light emitted by its associated light-emitting device. By this arrangement, the light emitted by the second repeater is of too long a wavelength to effect the input of the previous repeater in the chain. Such feedback may in some system be negligible in any event, since the light must pass back through the light-sensitive device of the second repeater, along the optical fibre cable, and then through the light-emitting device before it can affect the light-sensitive device of the first repeater.

Alternatively, the electrical output of the device of the invention could be used for a high sensitivity detector. Such a detector may be quieter than a silicon avalanche photodiode. The device has the advantages that it is simple to provide thresholding and limiting, and that it offers a reduction in the multiplication required compared to a similar device without optical feedback either as a light amplifier or as an electrical detector. It can also provide a large bandwidth, in terms of its electronic properties, if suitably constructed.

While particular embodiments of the invention have been described above, it will be appreciated that various modifications may be made by one skilled in the art without departing from the scope of the invention as defined in the appended claims.

What is claimed is:

1. A optoelectric device comprising:
   a light emitting device,
   a light sensitive device coupled directly in series with said light emitting device,
   first means for applying a voltage across said series connected devices, said voltage having a polarity such that said light sensitive device is reverse biased and said light emitting device is forward biased, said reverse bias of said light sensitive device causing said light sensitive device to be current blocking and preventing current flow through said light emitting device,
   light from an external light source being transmitted to said light sensitive device, causing said light sensitive device to conduct whereby current is permitted to flow through said light emitting device which emits light in response to said current flow,
   said light emitting device being so disposed in relationship to said light sensitive device such that a portion of the light emitted by said light emitting device is incident upon said light sensitive device to provide positive feedback whereby said light sensitive device permits additional current flow which provides for more light output from said light emitting device.

2. The device of claim 1 including additional means for providing light emission threshold control for said light emitting device.

3. The device of claim 2 wherein said additional means is a resistor in parallel with said light emitting device.

4. The device of claim 2 wherein said additional means is comprised of a diode, a resistor-capacitor network connected in series with said diode, and a field effect transistor having its source-drain path in parallel with said series-connected diode and reisitor-capacitor network and its gate coupled to the junction of said diode and said resistor-capacitor network.

* * * * *